United States Patent
Cappelletti et al.

(10) Patent No.: US 6,172,908 B1
(45) Date of Patent: Jan. 9, 2001

(54) CONTROLLED HOT-ELECTRON WRITING METHOD FOR NON-VOLATILE MEMORY CELLS

(75) Inventors: Paolo Cappelletti, Seveso; Bruno Ricco, Bologna; David Esseni, Monterenzio, all of (IT)

(73) Assignee: STMicroelectronics S.r.l., Agrate Brianza (IT)

( * ) Notice: Under 35 U.S.C. 154(b), the term of this patent shall be extended for 0 days.

(21) Appl. No.: 09/169,239

(22) Filed: Oct. 8, 1998

(30) Foreign Application Priority Data

Oct. 9, 1997 (EP) .................................................. 97830504

(51) Int. Cl.$^7$ .................................................. G11C 13/00

(52) U.S. Cl. .................................. 365/185.19; 365/185.18

(58) Field of Search .................... 365/185.18, 185.19, 365/185.28

(56) References Cited

U.S. PATENT DOCUMENTS

| | | | |
|---|---|---|---|
| 5,042,009 | 8/1991 | Kazerounian et al. | 365/185 |
| 5,481,492 | 1/1996 | Schoemaker | 365/185.23 |
| 5,487,033 | 1/1996 | Keeney et al. | 365/185.19 |
| 5,521,867 | 5/1996 | Chen et al. | 365/185.33 |
| 5,546,340 | 8/1996 | Hu et al. | 365/185.3 |
| 5,576,991 | 11/1996 | Radjy et al. | 365/185.24 |
| 5,576,992 * | 11/1996 | Mehrad | 365/185.24 |
| 5,856,946 * | 1/1999 | Chan et al. | 365/185.19 |
| 5,870,334 * | 2/1999 | Hemink et al. | 365/185.19 X |

FOREIGN PATENT DOCUMENTS

| | | |
|---|---|---|
| 0 463 331 A2 | 1/1992 | (EP) . |
| 0 744 754 A2 | 11/1996 | (EP) . |

OTHER PUBLICATIONS

Chi, Min–hwa and Albert Bergemont, "Multi–level Flash/EPROM Memories: New Self–convergent Programming Methods for Low–voltage Applications," *IEEE IEDM Technical Digest*, pp. 271–274, 1995.

Eitan, Boza et al, "Multilevel Flash cells and their Trade–offs," *IEEE IEDM Technical Digest*, pp. 169–172, 1996.

Yamada, Seiji et al., "Self–Convergence Erase for NOR Flash EEPROM Using Avalanche Hot Carrier Injection," *IEEE Transaction on Electron Devices*, 43(11):1937–1941, Nov. 1996.

Hu, Ching–Yuan, et al. "A Convergence Scheme for Over–Erased Flash EEPROM's Using Substrate–Bias–Enhanced Hot Electron Injection," *IEEE Electron Device Letters*, 16(11):500–502, Nov. 1995.

Takeda, E. et al., "New hot–carrier injection and device degradation in submicron MOSFETs," *IEE Proc.*, vol. 130, Pt. 1, No. 3, pp. 144–149 Jun. 1983.

(List continued on next page.)

* cited by examiner

Primary Examiner—Huan Hoang
(74) Attorney, Agent, or Firm—Theodora E. Galanthay; Robert Iannucci; Seed IP Law Group PLLC

(57) ABSTRACT

In order to optimize writing of the cell, the latter is written in a condition of equilibrium between an injection current $I_g$ and the displacement current $C_{pp}V_{sl}$. In this way, during writing, the voltage of the floating gate region $V_{fl}$ remains constant, as does the drain current and the rise in the threshold voltage. In particular, both for programming and for soft-writing after erasure, the substrate of the cell is biased at a negative voltage $V_{sb}$ with respect to the source region, and the control gate region of the cell receives a ramp voltage $V_{cg}$ with a selected predetermined inclination $V_{sl}$ satisfying an equilibrium condition $V_{sl} < I_{g,sat}/C_{pp}$.

15 Claims, 6 Drawing Sheets

OTHER PUBLICATIONS

Takeda, E., "Hot–carrier effects in submicrometre MOS VLSIs" *IEE Proc.*, vol. 131, Pt. 1, No. 5, pp. 153–161, Oct. 1984.

Wu, Ching–Yuan and Choiu–Feng Chen, "Physical Model For Characterizing And Simulating A FLOTOX EEPROM Device," *Solid–State Electronics,* 35(5), pp. 705–716, 1992.

Kong, Sik On and Chee Yee Kwok, "A Study Of Trapezoidal Programming Waveform For The FLOTOX EEPROM," *Solid–State Electronics*, 36(8), pp. 1093–1100, 1993.

Bez, Roberto et al., "Experimental Transient Analysis of the Tunnel Current in EEPROM Cells," *IEEE Transaction On Electron Devices*, 37(4), pp. 1081–1086, Apr. 1990.

Bude, J.D. et al., "EEPROM/Flash Sub 3.0V Drain–Source Bias Hot Carrier Writing," *IEEE IEDM Technical Digest*, 989–991, 1995.

Nissan–Cohen, Y., "A Novel Floating–Gate Method for Measurement of Ultra–Low Hole and Electron Gate Currents in MOS Transistors," *IEEE Electron Device Letters*, vol. EDL–7, No. 10, pp. 561–563, Oct. 1986.

Esseni, David et al., "Temperature Dependence of Gate and Substrate Currents in the CHE Crossover Regime," *IEEE Electron Device Letters*, 16(11), pp. 506–508, Nov. 1995.

Bez, R. et al, "A Novel Method For The Experimental Determination Of The Coupling Rations In Submicron EPROM and Flash EEPROM Cells," *IEEE IEDM Technical Digest,* pp. 99–102, 1990.

Montanari, D. et al., "Comparison Of The Suitability Of Various Programming Mechanisms Used For Multilevel Non–Volatile Information Storage," *Proc. ESSDERC Conf.*, p. 139, 1996.

CONTROLLED HOT-ELECTRON WRITING METHOD FOR NON-VOLATILE MEMORY CELLS

TECHNICAL FIELD

The present invention relates to a controlled hot-electron writing method for non-volatile memory cells. In particular, for the purposes of the present patent, the term "writing" indicates programming of the cell from an erased condition to a condition for storing a desired threshold value, and the operation of "soft-writing" means correcting the threshold voltage of overwritten cells (which involves the partial re-writing of the cells so as to set them all to the same erase threshold voltage).

BACKGROUND OF THE INVENTION

As is known, non-volatile memories are becoming increasingly important in modern-day microelectronics, both as separate components and as components forming part of more complex devices; in this context, flash memories play a leading role, which is expected to increase significantly in the future.

Flash memories (as well as EPROMs) use the technique of hot electron injection for programming of the cells. As is known, programming presents two problems which are particularly critical in the case of multilevel programming used to store more than one bit for each cell: a) accurate control of the programmed threshold voltages; and b) control and limitation of the drain current flowing in the cell during programming.

The second problem, in particular, directly affects the possibility of operating in parallel on a large number of cells, which is of crucial importance for the operation of "soft-writing" erased flash cells. In general, however, this control function is important for achieving an increase in the performance during the storage of information.

In general, limitation of the cell current represents only one aspect of the more complex problem of controlling the current since, in order to optimize writing, the drain current should theoretically remain constant during the entire operation, so as to avoid high initial current peaks, followed by lower currents, which result in inefficient programming.

On the other hand, the problem of accurately controlling the programmed threshold voltage is important for digital memories and is absolutely crucial for multilevel storage, in view of the limited margins which separate the various levels within the available threshold window.

At present, in order to control the threshold after a programming stage, a verify operation consisting of reading the programmed cell is carried out. This method, however, involves a long and complicated procedure as well as a considerable use of space; consequently, the possibility of controlling in an accurate and reliable manner the threshold voltage of the cell during programming would be highly desirable.

The conventional writing procedure used for the present generation of flash memories (and EPROMs) uses rectangular pulses for the control gate and drain voltages ($V_{cg}$ and $V_d$, respectively); consequently, programming is characterized by high drain currents, in particular at the start of the programming pulse, when the overdrive voltage (i.e., the difference between the control gate voltage and the threshold voltage) is high.

Some solutions have therefore been proposed in order to limit the drain current and/or control the overdrive current, but none of them achieves the ideal result of programming the cell with a constant current.

SUMMARY OF THE INVENTION

An object of the invention is therefore to provide an improved writing method for flash memories able to operate with a constant drain current, at least for a substantial part of the programming time.

According to the present invention, a controlled hot-electron writing method for non-volatile memory cells is provided. The method includes applying appropriate biasing voltages to a drain and control gate of a non-volatile memory cell and, at the same time, holding a floating gate voltage substantially constant during at least part of the time during which the non-volatile cells are being programmed.

According to the detailed description given below, in order to optimize writing of the cell, the latter is written in an equilibrium condition, with a constant floating gate region voltage and currents. In particular, both for programming and soft-writing after erasing, the substrate region of the cell is biased at a negative voltage with respect to the source region, and the control gate region of the cell receives a ramp voltage having a slope selected so that it is possible to achieve the condition of an equilibrium between the injection current flowing towards the floating gate region and the displacement current associated with the equivalent capacitor arranged between the floating gate and control gate regions.

BRIEF DESCRIPTION OF THE DRAWINGS

For understanding the invention, a preferred embodiment thereof is now described, purely by way of a non-limiting example, with reference to the accompanying drawings.

DETAILED DESCRIPTION OF THE INVENTION

Figure 1:
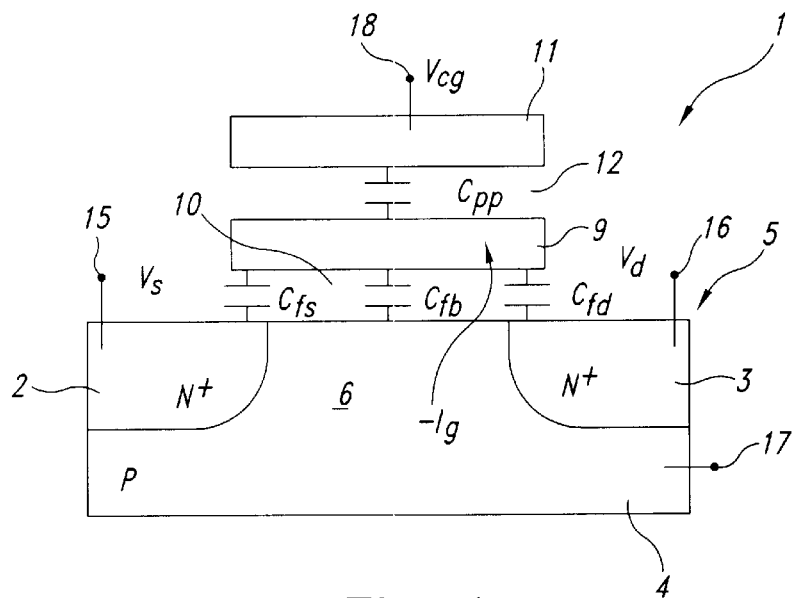
FIG. 1 shows a cross-section through a conventional flash cell.

In order to understand the physical phenomena underlying the present invention, reference should be made initially to FIG. 1 showing a conventional flash cell. The flash cell 1 comprises a source region 2 and drain region 3 of the N$^+$ type embedded in a substrate 4 of the P type having a surface 5 and defining, in the surface portion arranged between the source region 2 and the drain region 3, a channel region 6. A floating gate region 9 extends over the substrate 4, above the channel region 6, and is separated electrically from the latter by a tunnel oxide layer 10. In a known manner, the floating gate region 9 is isolated electrically from all the other conducting regions of the cell. A control gate region 11 extends above the floating gate region 9, isolated electrically from the latter by a dielectric layer 12. The source region 2, drain region 3, control gate region 11 and the substrate 4 are biased through their own contact regions, schematically indicated by electrodes 15, 16, 17 and 18.

On the basis of the conventional capacitive model of the flash cell 1, when the cell is biased so as to be on and the source region 2 is grounded, the coupling between cell regions 2, 3, 9 and 11 is described by equivalent capacitors, shown in FIG. 1. In particular, $C_{fs}$ represents the coupling between the floating gate region 9 and the source region 2; $C_{fb}$ represents the coupling between the floating gate region 9 and the substrate 4 (channel region 6); $C_{fd}$ represents the coupling between the floating gate region 9 and the drain region 3; and $C_{pp}$ represents the coupling between the floating gate region 9 and the control gate region 11.

In the cell 1, the voltage of the floating gate region $V_{fg}$ is a function of the threshold voltage $V_T$ (voltage of the control gate region at which the cell is activated), of the control gate voltage $V_{cg}$ applied to the control gate region 11 and of the drain voltage $V_d$ applied to the drain region 3 and may be described by the following relation:

$$V_{fg} = V_{T\text{-}fg} + \alpha_{fc}(V_{cg} - V_T) + \alpha_{fd}(V_d - V_{dT}) \quad (1)$$

in which $\alpha_{fc}$ and $\alpha_{fd}$ are the coupling coefficients, $V_{T\text{-}fg}$ is the floating gate threshold voltage (voltage of the floating gate region at which the cell is turned on), and $V_{dT}$ is the drain region voltage used for measuring $V_T$.

The threshold voltage $V_T$ obviously depends on the charge ($Q_{fg}$) stored in the floating gate region 9 and is typically expressed by:

$$V_T = \frac{V_{T\text{-}fg}}{\alpha_{fc}} - \frac{Q_{fg}}{C_{pp}} - \frac{\alpha_{fd}}{\alpha_{fc}} \cdot V_{dT} \quad (2)$$

By substituting (2) in (1), the following well known equivalent expression for the voltage $V_{fg}$ is obtained:

$$V_{fg} = \alpha_{fc} V_{cg} + \alpha_{fd} V_d + \frac{Q_{fg}}{C_T} \quad (3)$$

in which the identity $\alpha_{fc}/C_{pp} = 1/C_T$ has been used, and $C_T = C_{pp} + C_{fs} + C_{fd} + C_{fb}$.

During the programming stage, $V_{cg}$, $V_d$ and $Q_{fg}$ generally vary with time. In particular, the time derivative of $V_T(t)$ may be obtained from (2) and is equivalent to:

$$\dot{V}_T = \left[\frac{dV_T}{dt}\right] = -\frac{\dot{Q}_{fg}}{C_{pp}} = \frac{I_g}{C_{pp}} \quad (4)$$

in which $I_g$ indicates the injection current (FIG. 1) and by definition $I_g = -\dot{Q}_{fg} = -[dQ_{fg}/dt]$.

Moreover, deriving over time (3) gives:

$$\dot{V}_{fg} = \left[\frac{dV_{dg}}{dt}\right] = \alpha_{fg}\dot{V}_{cg} + \alpha_{fd}\dot{V}_d - \frac{I_g}{C_T} = \frac{1}{C_T} \cdot \left[C_{pp}\dot{V}_{cg} + C_{fd}\dot{V}_d - I_g\right] \quad (5)$$

Figure 2A:
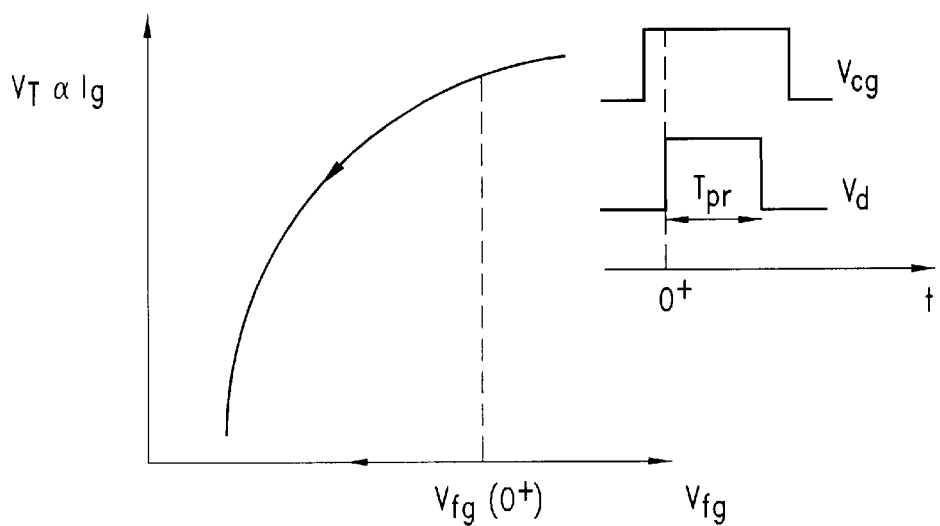
FIGS. 2a and 2b show the relation between two electrical parameters of the flash cell of FIG. 1 in two different biasing conditions according to the known method.

In the case of conventional programming, in which $V_{cg}$ and $V_d$ have a rectangular form, (5) is reduced to:

$$\dot{V}_{fg} = -\frac{I_g}{C_T} \quad (5')$$

and the injection current $I_g$ has the qualitative behavior shown in FIG. 2a. During programming, $V_{fg}$ is a decreasing monotone function (as shown schematically by the direction of the arrow along the abscissa) and therefore the drain current $I_d$ of the cell and the programming velocity $\dot{V}_T$ also decrease monotonically.

Figure 2B:
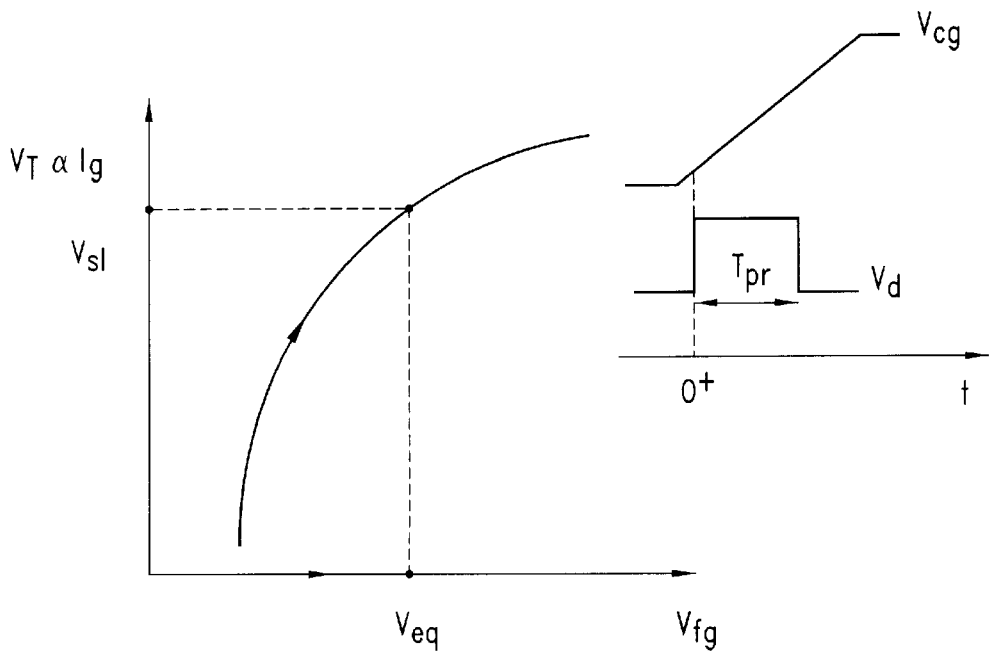

On the other hand, according to the present method, the control gate voltage is made to increase linearly with a predetermined slope $\dot{V}_{cg} = V_{sl}$ and at the same time a rectangular drain voltage is applied. In this condition the floating gate voltage $V_{fg}$ increases until it reaches an equilibrium condition and further programming of the cell is performed at a virtually constant floating gate voltage ($V_{fg} = V_{eq}$); moreover, the drain current $I_d$ increases monotonically with $V_{fg}$ up to the equilibrium value (as shown in FIG. 2b) and therefore remains constant.

In fact, by biasing the cell as described, (5) becomes:

$$\dot{V}_{fg} = \frac{1}{C_T} \cdot [C_{pp}V_{sl} - I_g(V_{fg})] \quad (6)$$

in which the drain voltage is considered constant.

The essential evolution of the programming stage may be described as follows. At the start of the ramp of the control gate voltage, when $V_{fg}$ is relatively small, the injection of hot electrons is very low; therefore the second term of (6) may be disregarded and $V_{fg}$ increases with $V_{cg}$ owing to the effect of the first term of (6). Assuming that the injection current $I_g$ is a greatly increasing function of $V_{fg}$ (as discussed in detail below), $\dot{V}_{fg}$ decreases gradually until it becomes zero when $[I_gV_g]$ is equivalent to $[C_{pp}V_{sl}]$.

At this point, the floating gate voltage $V_{fg}$ has reached its equilibrium value $V_{eq}$ corresponding to the equilibrium between the injection current $I_g$ and the displacement current $[C_{pp}V_{sl}]$, therefore the floating gate voltage remains constant even in the presence of further variations in the control gate voltage $V_{cg}$.

Figure 3A:
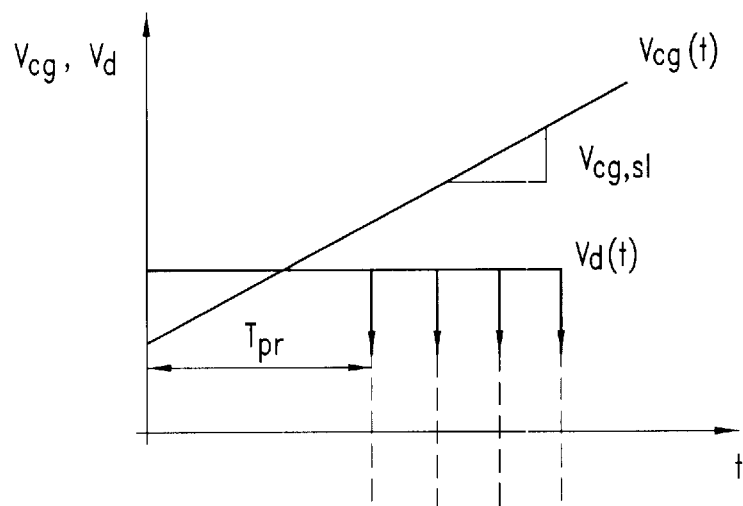
FIGS. 3a, 3b and 3c show the plot of three electrical parameters of cell with the programming method according to the invention.
Figure 3B:
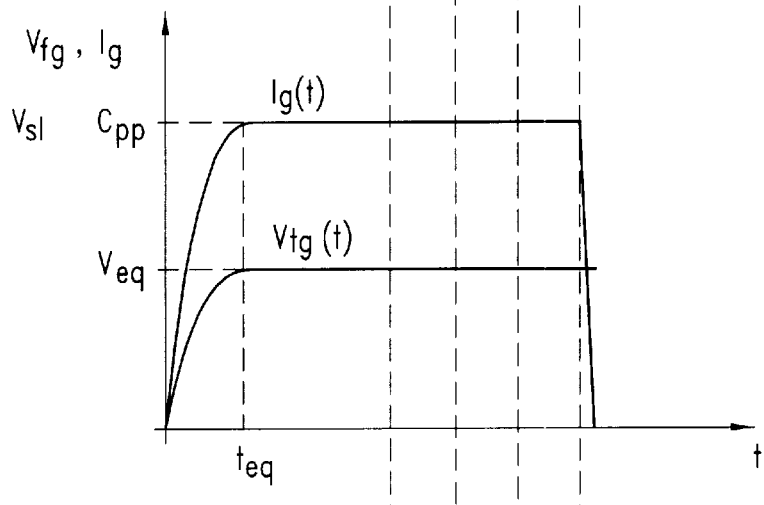
Figure 3C:
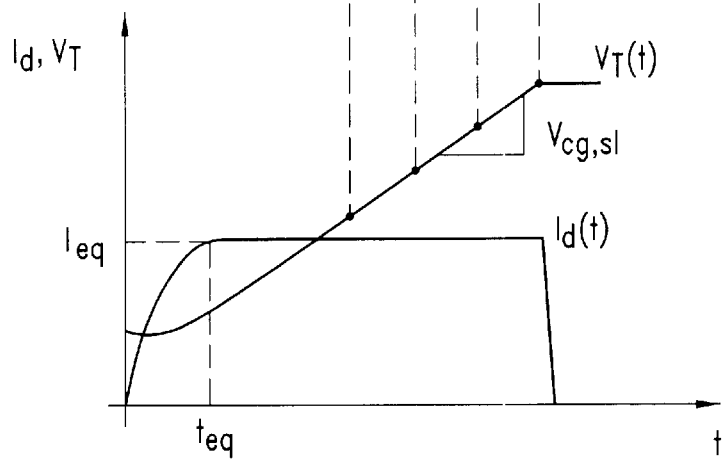

Qualitative waveforms for $V_{cg}$ and $V_d$ according to the invention are shown in FIG. 3a; FIG. 3b shows the behavior of the voltage $V_{fg}$ and the injection current $I_g$. In these figures, $T_{pr}$ represents the programming time, while $t_{eq}$ indicates the time necessary to reach the equilibrium condition $I_g(V_{fg}) = C_{pp}V_{sl}$. FIG. 3c shows the behavior of the threshold voltage $V_T$ and the drain current $I_d$; as shown, after reaching the equilibrium, since $V_{fg}$ and $V_d$ are constant, the drain current also becomes constant and hence $I_d = I_{eq}$. Moreover, as can be seen clearly from (4), assuming $I_g = C_{pp}V_{sl}$, $\dot{V}_T = V_{sl}$ is obtained, and hence the threshold voltage $V_T$, in the equilibrium condition, follows exactly the trend of the control gate voltage, imposed externally.

From the above it is clear that two essential conditions exist for achieving the equilibrium condition and hence programming of the cell with a constant drain current, namely that the injection current $I_g$ should be a monotonically increasing function of $V_{fg}$, preferably greatly increasing, and that the slope of the control gate voltage $V_{sl}$ should be such that it is possible to reach the condition of equilibrium between the injection current and the displacement current, namely that the injection current $I_g$, during its increase, is able to become equal to the displacement current $C_{pp}V_{sl}$.

The first condition (injection current increasing, preferably rapidly, with the floating gate voltage) is ensured by the type of programming (hot electron injection) and by biasing the substrate with a negative voltage, as discussed below in detail; the second condition requires that the slope of the ramp of the control gate voltage should not be too high. In particular, since the injection current $I_g$ tends to become saturated when the floating gate voltage $V_{fl}$ nears the drain voltage $V_d$ (see FIG. 4, showing the experimental results), this condition requires that the slope $V_{sl}$ should be less than a maximum value namely $$V_{sl} < I_{g,sat}/C_{pp}, \qquad (7)$$

with $I_{g,sat}$ the saturation value.

Biasing the substrate (body) of the cell at a negative voltage with respect to the source region 2 has the purpose, on the one hand, of reducing and improving control of the value of the drain current used during writing and, on the other hand, of increasing the injection current, so that it is a greatly increasing function of the floating gate voltage. In this way, the first condition described above for achieving the equilibrium situation is satisfied and programming is performed with an injection characteristic $I_g(V_{fg})$ suitable for rapidly reaching the equilibrium, ensuring that it is reached at an early stage of writing and in any case before the end thereof. The application of a voltage ramp to the control gate region and a negative substrate voltage therefore operates in a synergic manner so as to optimize the programming operation, as is clear from the results of the experiments described below.

Figure 4:
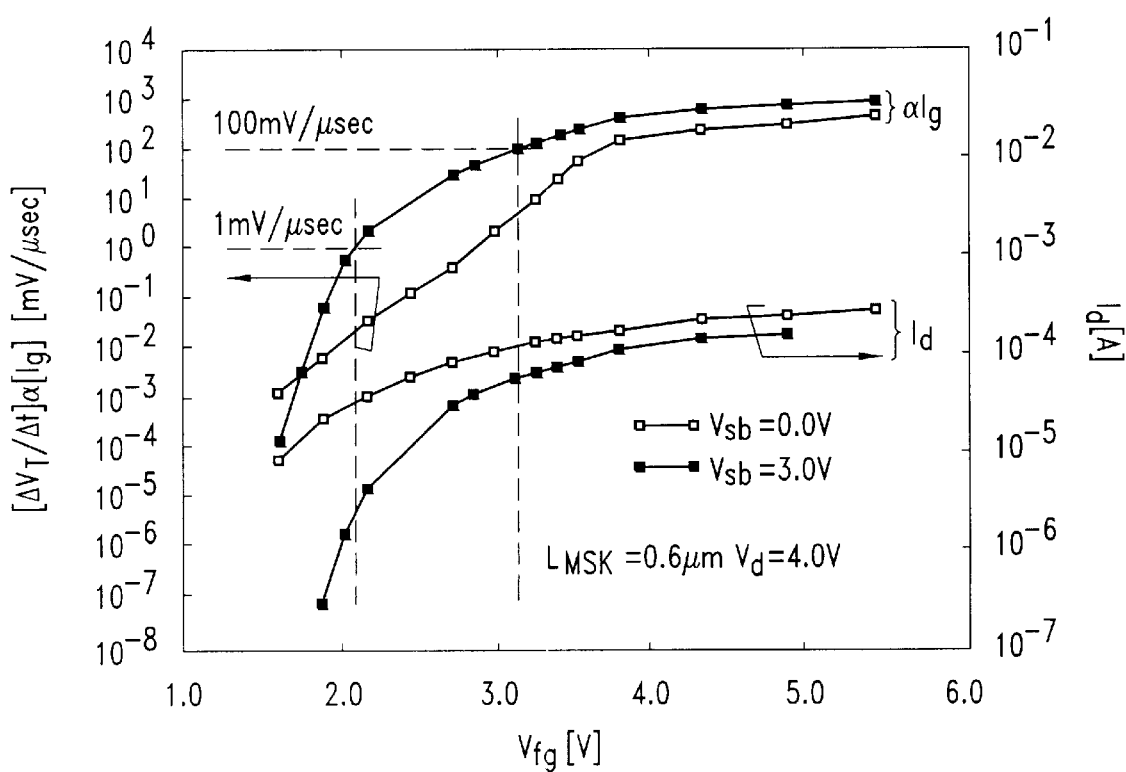
FIG. 4 shows the plot of other physical parameters of the flash cell of FIG. 1 with the programming method according to the invention.

In particular, the present method includes biasing the substrate with the source-body voltage $V_{sb}$, ranging between 0.5 and 4 V, depending on the type of device, the operating voltages thereof and its value may be optimized on the basis of the results of FIG. 4.

The application of a negative substrate voltage (source-body voltage $V_{sb} > 0$) causes an increase in the injection current, as shown in FIG. 4, which shows the characteristics of the injection current $I_g$ and drain current $I_d$ for a cell of 0.6 $\mu$m for $V_{sb}=0$ and $V_{sb}=3$ V. The figure also shows the equilibrium values of $V_{fg}$ corresponding to slopes $V_{sl}=1$ mV/$\mu$s and 100 mV/$\mu$s. In particular, from the figure it will be noted that it is possible to highlight a range of floating gate voltages $V_{fg}$ in which there is an improved behavior of the injection currents and drain current and in which in particular the injection current is greatly increasing with $V_{fg}$, so as to ensure the conditions for reaching the equilibrium.

The results of the experiments carried out have confirmed all the qualitative characteristics described above as regards both programming and soft-writing of the cell.

In particular, when writing is used for multilevel programming it is necessary to obtain different thresholds with a same injection mechanism, which may be obtained either using pulses with a different amplitude and the same duration or pulses with the same amplitude and different duration. In the case of the ramp form used here, it is possible to obtain different threshold voltages by simply varying the width of the drain pulse, since, when $V_d$ falls low again, the threshold voltage no longer rises and the programming operation is interrupted. FIGS. 3a and 3b show how it is possible to obtain an arbitrary threshold voltage using a same waveform of the control gate voltage by adjusting the duration of the pulse $T_{pr}$.

Figure 5A:
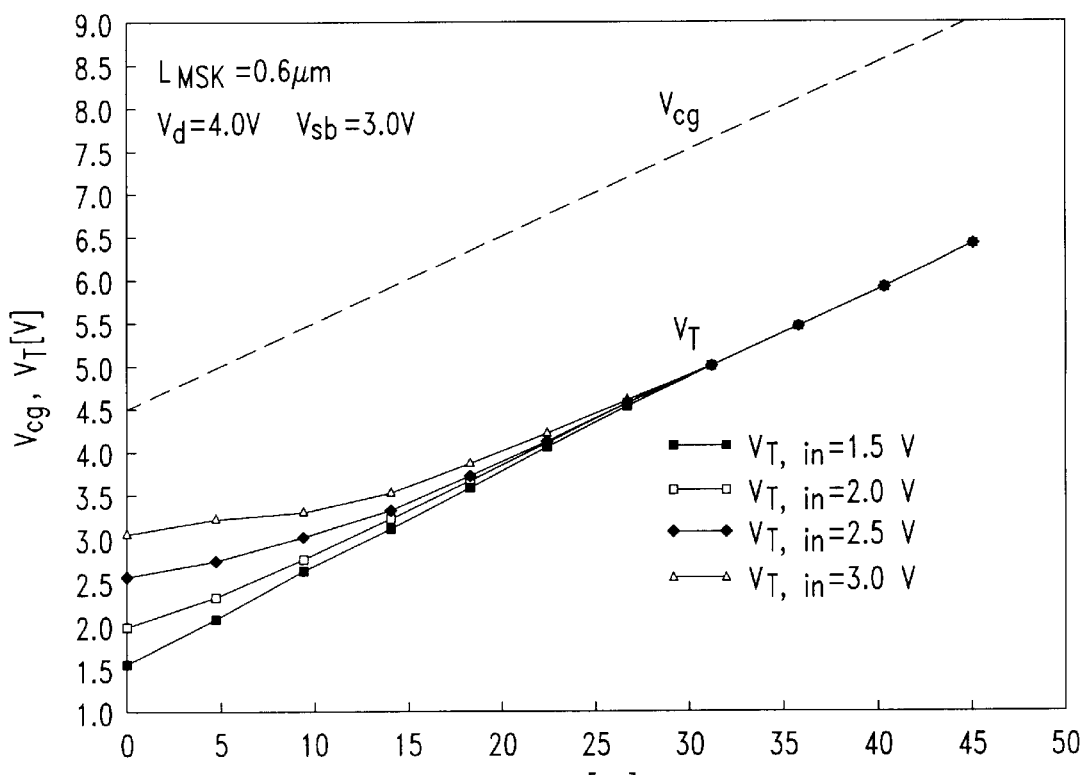
FIGS. 5a and 5b show the plot of other parameters in a first implementation of the present method.
Figure 5B:
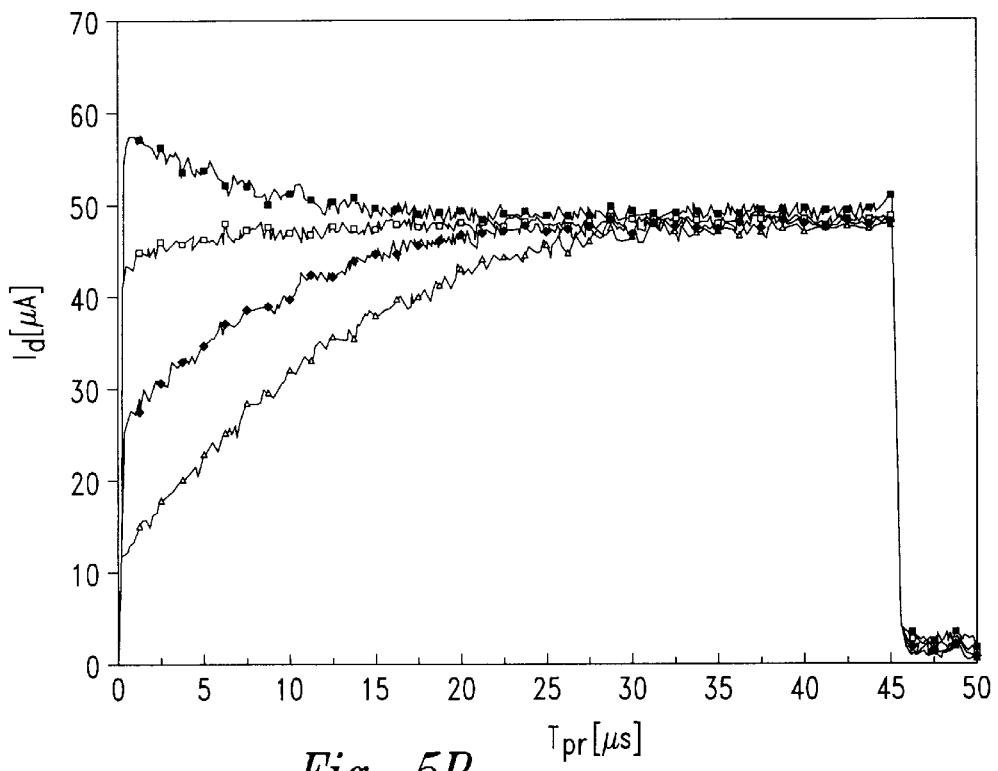
Figure 6:
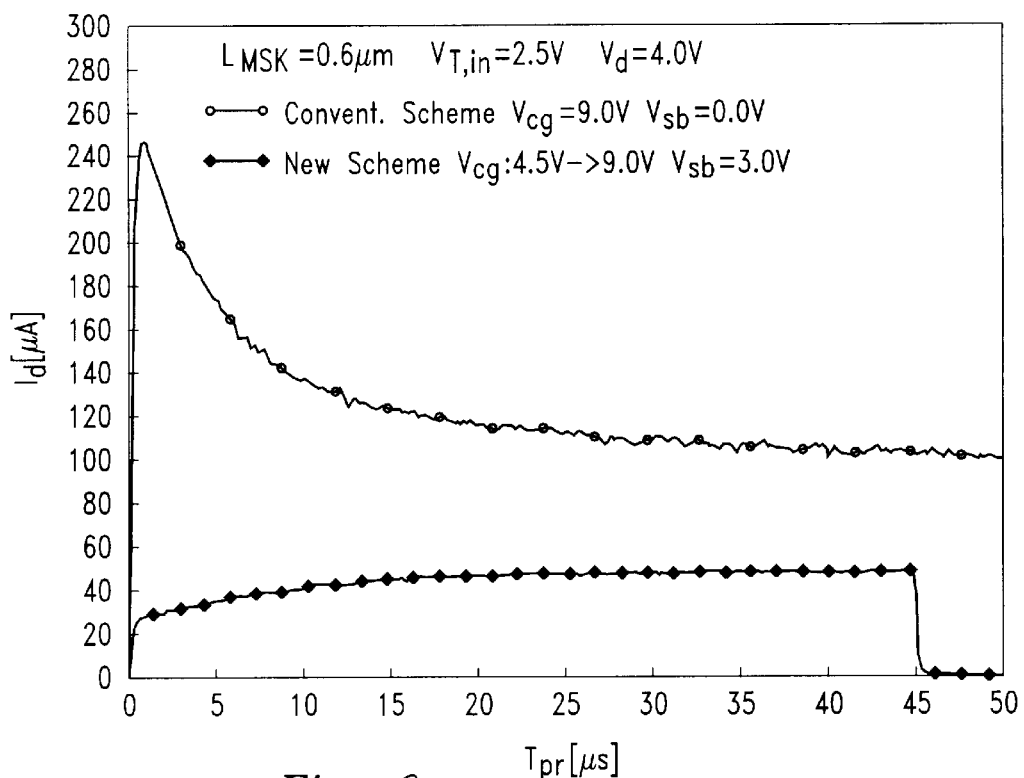
FIG. 6 relates to other parameters with the first implementation of the present method.

Results obtained during the programming of cells with a control gate voltage $V_{cg}$ having a positive initial value, slope $V_{sl}$ of 100 mV/$\mu$s (corresponding to an equilibrium drain current $I_{eq}$ of 50 $\mu$A and a floating gate voltage $V_{fg} \cong 3.1$ V) are shown in FIGS. 5a and 5b, in which the different characteristics correspond to different values of the initial threshold voltage. It is significant to note that the use of the ramp voltage eliminates the presence of current peaks (or "spikes") which are typical of the conventional method with rectangular control gate voltage and without biasing the substrate. In this connection reference should be made also to FIG. 6 in which the waveforms have been adjusted so that the thresholds and the programming times are approximately the same. As is known, the new method of programming allows a maximum drain current $I_d$ five times smaller than that of the conventional method to be obtained.

Figure 7A:
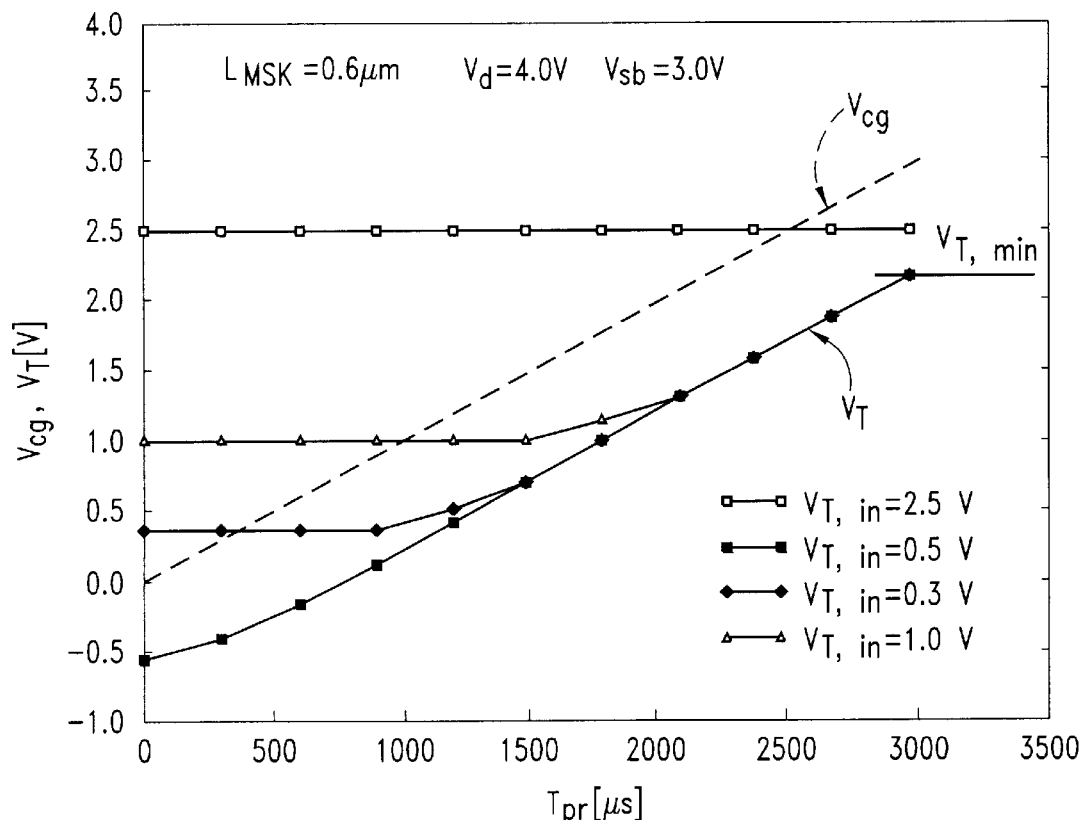
FIGS. 7a and 7b show the plot of the parameters of FIGS. 5a and 5b in a second implementation of the present method.
Figure 7B:
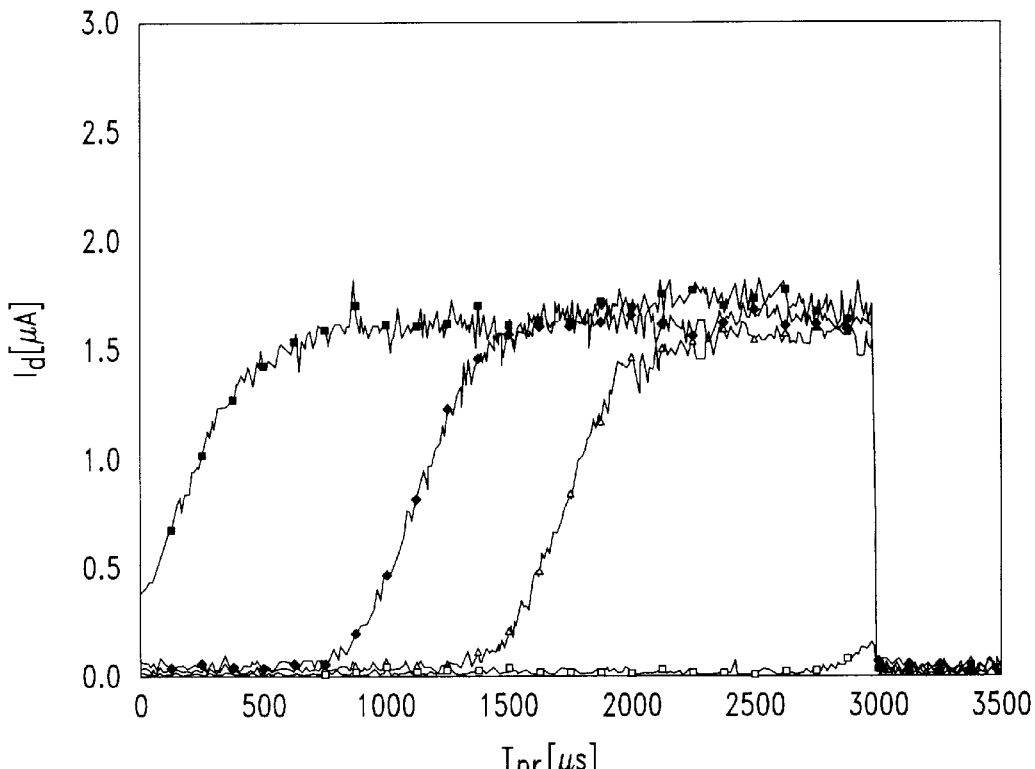

When soft-writing is used to recover overwritten cells it is of primary importance to reduce the drain current $I_d$ flowing in each cell and control precisely the threshold voltage $V_{T,min}$ towards which the cells must converge. In this case, during experimental tests carried out, a slope of $V_{sl}=1$ mV/$\mu$s was used, corresponding to a soft-writing programming time of 3 ms, a current of 1.5 $\mu$A and an equilibrium voltage $V_{eq}$ of 2.1 V. The experimental results obtained are shown in FIGS. 7a and 7b. In general, the soft-writing programming time and current consumption may be adjusted over a wide range of values and it is possible to estimate with great accuracy the drain current for a given value of the slope using the data of FIG. 4.

As will be noted from FIG. 7b, after an initial transient corresponding to $t_{eq}$ of FIG. 3b, the current $I_d$ is virtually independent of the initial threshold voltage which influences only the moment when writing starts. Moreover, when a cell has a threshold voltage greater than $V_{T,min}$, its threshold is not altered by the writing procedure.

Moreover, since the drain current $I_d$ of each cell is virtually constant over time and independent of the initial threshold value and since the cells with an initial voltage greater than the desired value are not activated, the current used by a group of cells may be easily estimated knowing the initial distribution of the erase thresholds.

Figure 8:
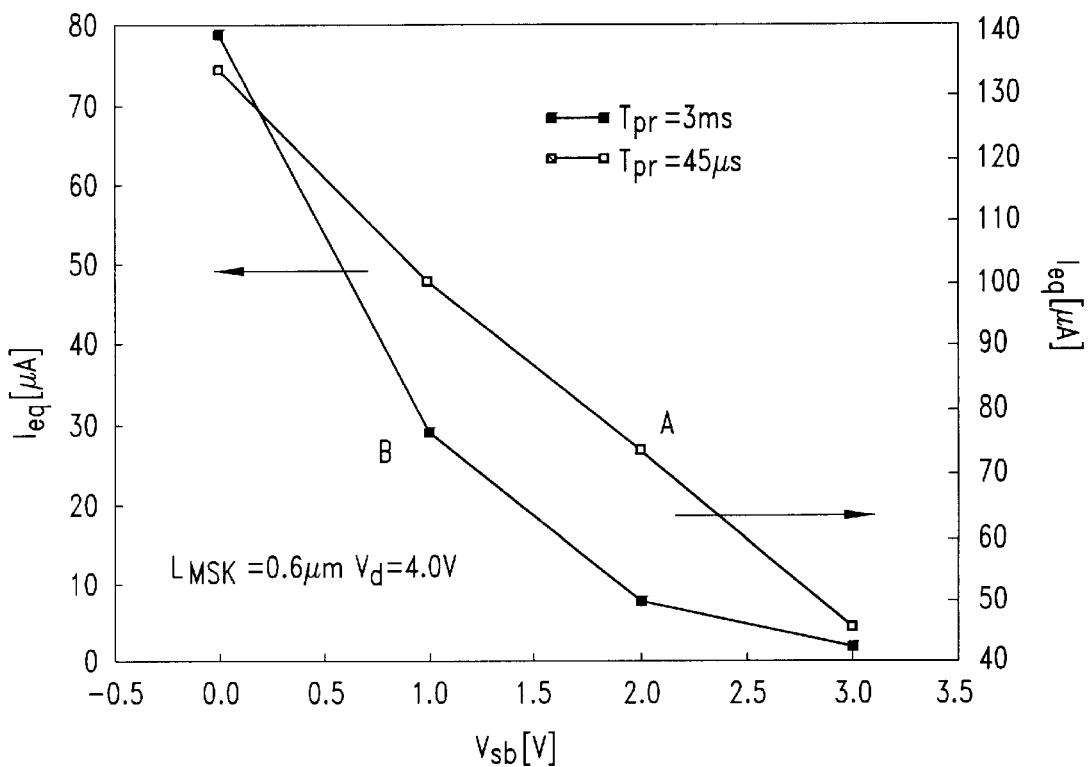
FIG. 8 shows the comparative plot of an electrical parameter in the case of programming and soft-writing.

FIG. 8, finally, shows the plot of the equilibrium drain current $I_{eq}$ versus $V_{sb}$ in the case of programming with $T_{pr}=45$ $\mu$s (curve a) and soft-writing with $T_{pr}=3_{ms}$ (curve b), for a drain voltage $V_d=4$ V. As will be noted, for a given drain voltage, the use of a negative substrate voltage reduces monotonically the current necessary for programming or re-writing the cell in a given time period. As may be noted, the reduction in current has a similar plot in both cases, but the effect is particularly evident in the case of soft-writing, where a voltage $V_{sb}=3$ V provides a reduction in current about forty times greater than in the case of $V_{sb}=0$ V.

The ramp form may be obtained by means of an analog block (typically an integrator) or, for reasons associated with the practical implementation, the ramp may be emulated by a small-step waveform. The step approximation results in a current which has a ripple evolving about a mean value fixed by the (mean) slope of the stepped waveform itself. It is therefore clear that the application of a stepped waveform involves a deviation from the ideal behavior and therefore imposes an upper limit on the duration and the amplitude of the steps, a limit which is fixed by the need to limit the band of values inside which the drain current must in any case be maintained.

In particular, if the transconductance of the cell in the equilibrium condition (to which the equilibrium drain current $I_{eq}$ corresponds) is called $G_{m,eq}=(dI_{eq}/dV_{cg})$ and if $\Delta V_{cg}$ indicates the step amplitude in the ramp emulation, the current variation $\Delta I_{eq}$ can be expressed as $\Delta I_{eq}=G_{m,eq} \cdot \Delta V_{cg}$. If the current percentage variation is required to be less than a predetermined value $V\%=(\Delta I_{eq}/I_{eq})$, it is therefore necessary to ensure that:

$$\Delta V_{cg} < /(I_{eq}/G_{m,eq}) \cdot V\%$$

Once the values of $\Delta V_{cg}$ have been determined, all the parameters of stepped waveform are fixed since, if $T_{pr}$ indicates the programming time and $V_{cgSW}$ the overall voltage swing at the control gate region, the number of steps must be equal to $N=V_{cgSW}/\Delta V_{cg}$ and the duration of the individual step is equal to $T_{pr}/N$.

This criterion provides in practice steps with a duration ranging between 1 µs and 10 ms depending on whether writing relates to programming of the cell or soft-writing.

The advantages of the described method are the following. Firstly, writing of the cells in a condition of equilibrium between the injection current and the displacement current (and, hence, as described, with constant floating gate voltage, drain current and threshold voltage increase), produces continuous control of the programming parameters and hence optimum programming of the cells. Since, in the equilibrium condition, the drain current is controlled and constant, additional current-limiting circuits are not necessary and hence the associated circuitry is simplified. Accurate control of the threshold voltage and drain current by the slope of the voltage ramp applied to the control gate region allows both rapid and accurate writing of multiple threshold voltages during the programming of multilevel memories and slow writing with low-consumption and high parallelism of a plurality of cells for soft-writing. Moreover, the biased substrate ensures that the cell may reach the equilibrium condition rapidly and reliably, acting in synergism with application of the ramp gate voltage.

The method has a high degree of flexibility, may be used in a dynamic and adaptable manner during the test and during operation of the cells, by choosing the slope of the ramp so as to optimize the programming time and current consumption within a wide range of values, and may therefore be used both for digital and multilevel programming and for the soft-writing of cells after erasure.

Finally it is obvious that numerous modifications and variations may be made to the method described and illustrated herein, all of which falling within the scope of the inventive idea, as defined in the accompanying claims.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A controlled hot-electron writing method for non-volatile memory cells each comprising a source region, a drain region separated from said source region by a channel region formed in a semiconductor material body, a floating gate region extending over at least part of said channel region and set to a floating gate voltage and a control gate region extending over at least part of said floating gate region, said method comprising applying biasing voltages to said drain region and control gate region, and to said body, the biasing voltage applied to said body being contemporaneously negative with respect to a voltage of said source region and a voltage of said drain region, wherein said floating gate voltage is maintained substantially constant during at least part of the programming time.

2. The method according to claim 1 wherein said step of maintaining comprises the steps of applying to said control gate region a ramp voltage with a predetermined mean slope, said predetermined mean slope being less than the ration of the saturation injection current flowing from said channel region to said floating gate region in the saturation condition and the coupling capacitance between said floating gate region and control gate region.

3. The method according to claim 2 wherein said ramp voltage is increased linearly in a continuous manner.

4. The method according to claim 2 wherein said ramp voltage is increased linearly in a discrete manner and forms a plurality of steps.

5. The method according to claim 4 wherein each step has a duration ranging between 1 µs and 10 µs.

6. The method according to claim 2 wherein said negative voltage ranges between −0.5 and −4 V.

7. A method for programming the threshold of non-volatile memory cells according to the method of claim 1.

8. A method for soft-writing non-volatile memory cells according to the method of claim 1.

9. In a memory device comprising a plurality of non-volatile memory cells formed on a substrate body, each memory cell comprising a source region and a drain region separated by a channel region, a floating gate disposed over the channel region, and having a floating gate voltage, and a control gate disposed over the floating gate, a method for controlled writing to one of the plurality of cells comprising, in the one cell:

applying a bias voltage to the drain region;

applying a second bias voltage to the control gate;

applying a third bias voltage to the substrate body, the third bias voltage being contemporaneously negative relative to a voltage of the source region and a voltage of the drain region; and maintaining the floating gate voltage constant for a portion of the time the cell is being written.

10. The method of claim 9 wherein the floating gate voltage constant comprises applying a ramp voltage having a mean slope to the control gate.

11. The method of claim 10 wherein the mean slope is less than a ratio of a saturation injection current flowing from the channel region while the memory cell being written to is in a saturation condition, to a coupling capacitance between the floating gate and the control gate.

12. The method of claim 10 wherein the ramp voltage is continuously, linearly increasing.

13. A memory device comprising:

a plurality of memory cells integrated on a semiconductor substrate body, each memory cell comprising a source region and a drain region separated by a channel region, a floating gate disposed over the channel region, and having a floating gate voltage, and a control gate disposed over the floating gate;

a first bias circuit structured to apply a first bias voltage to the drain region of one of the cells;

a second bias circuit structured to apply a second bias voltage to the control gate of the one of the cells;

a third bias circuit structured to apply a third bias voltage to the substrate body, the third bias voltage being contemporaneously negative relative to a voltage of the source region and a voltage of the drain region of the one of the cells; and a writing circuit structured to maintain the floating gate of the one of the cells at a constant voltage for a portion of the time the cell is being written to.

14. The memory device of claim 13 wherein the writing circuit is structured to apply a ramp voltage to the control gate.

15. The memory device of claim 14 wherein the ramp voltage is applied with a mean slope less than a ratio of a saturation injection current flowing from the channel region of the one of the cells while it is in a saturation condition, to a coupling capacitance between the floating gate and the control gate.

* * * * *